United States Patent [19]

Naganuma et al.

[11] Patent Number: 5,028,989

[45] Date of Patent: Jul. 2, 1991

[54] SEMICONDUCTOR COOLING MODULE

[75] Inventors: Yoshio Naganuma, Hitachi; Atsushi Morihara, Katsuta; Katsunori Ouchi, Hitachi; Koji Sato, Hitachi; Hiroshi Yokoyama, Hitachi, all of Japan

[73] Assignee: Hitachi, Ltd., Tokyo, Japan

[21] Appl. No.: 526,990

[22] Filed: May 22, 1990

[30] Foreign Application Priority Data

Jun. 3, 1989 [JP] Japan .................................. 1-141478

[51] Int. Cl.[5] ...................... H01L 23/02; H01L 25/04
[52] U.S. Cl. ........................................ 357/82; 357/81; 361/382; 361/385; 165/80.4; 165/104.33
[58] Field of Search ................... 357/82, 81; 361/382, 361/385; 165/80.4, 104.33

[56] References Cited

U.S. PATENT DOCUMENTS

| 3,361,354 | 7/1968 | Johnston | 239/127 X |
|---|---|---|---|
| 3,977,605 | 8/1976 | Sheldon | 239/172 X |
| 3,993,123 | 11/1976 | Chu et al. | 165/80 |
| 4,153,107 | 5/1979 | Antonetti et al. | 165/185 |
| 4,193,445 | 3/1980 | Chu et al. | 165/79 |
| 4,274,585 | 6/1981 | Lestradet | 239/157 X |
| 4,349,154 | 9/1982 | Pacht | 239/124 |
| 4,373,669 | 2/1983 | Swanson | 239/124 |
| 4,639,829 | 1/1987 | Ostergren et al. | 361/386 |
| 4,697,739 | 10/1987 | McCraoken et al. | 239/157 X |
| 4,908,695 | 3/1990 | Morihara et al. | 357/81 |
| 4,925,096 | 5/1990 | Gill | 239/172 X |

FOREIGN PATENT DOCUMENTS 0206148 12/1983 Japan ..................................... 357/82

OTHER PUBLICATIONS

IBM Tech. Disclosure, "Designs for Providing Thermal Interface Material . . . ," R. C. Chu, vol. 20, No. 7, 12/77, p. 2761.

Primary Examiner—Rolf Hille
Assistant Examiner—David Ostrowski
Attorney, Agent, or Firm—Antonelli, Terry, Stout & Kraus

[57] ABSTRACT

A plurality of semiconductor elements are mounted on a substrate. A plurality of cooling elements are inserted between a thermal conductor for conducting a heat generated from the semiconductor elements to a cooling medium and the semiconductor elements. A channel for conducting the generated heat of the semiconductor elements to the cooling medium is provided near the cooling elements and between the thermal conductor and a channel plate mounted on the thermal conductor.

15 Claims, 3 Drawing Sheets

SEMICONDUCTOR COOLING MODULE

FIELD OF THE INVENTION

The present invention relates to a semiconductor cooling module and, more particularly, to a semiconductor cooling module for use in efficiently removing the heat generated at a plurality of semiconductors or a plurality of integrated circuits of a high degree of integration.

BACKGROUND OF THE INVENTION

In a semiconductor apparatus which is used for an electronic apparatus such as an electronic computer, the degree of integration of circuits has increased to a high level, so that the quantity of heat generated at the semiconductor apparatus has greatly increased. The semiconductor apparatus for use in a large-scale computer has been adapted a module structure which packages a plurality of semiconductor elements thereinto in order to reduce the length of the electric lines between each element and increase calculating speed of the large-scale computer. Removal of the heat generated during the operation of the large-scale computer is indispensable serious problem for maintaining stable operation performance thereof.

In general, a cooling system has been employed wherein the module mounting a plurality of semiconductor elements absorbs the heat generated from the semiconductor elements a cooling medium flow, for example, water through a cooling jacket attached to the module. A system of the aforementioned type is disclosed, for example in FIG. 5 of WO 89/12319, published Dec. 14, 1989 entitled "Semiconductor Packing Module and Heat Conducting Block Structure Used Therefore". In this system cooling water enters into a protrusion with a triangular cross section of the heat-conducting block and flows near the semiconductor elements.

Further, a cooling system has been proposed in, for example, U.S. Pat. No. 4,193,445, wherein the heat generated from the semiconductor elements mounted on a substrate is conducted to the cooling medium enclosed in the cooling jacket through the piston-type cooling elements which contact to the semiconductor elements and move slidably into the thermal conductor. The cooling elements mentioned contact to the pistons through compression springs, respectively, for performing sufficient heat conduction of heat generated from the semiconductor elements.

According to the heat-conducting block shown in FIG. 5 of WO 89/12319, the fin is required for flowing the cooling water to the cooling fin mounted on the lower heat conductive block. The outlet for flowing the cooling medium is required between the cooling fine and the lower heat conductive block. The structure shown in WO 89/12319 is complex and the cooling effect thereof is not always sufficient.

In the cooling system which comprises the thermal conductor and the cooling jacket as proposed in U.S. Pat. No. 4,193,445, the thermal resistance of the contacting portions, between the thermal conductor and the cooling jacket creates a problem which disturbs the thermal conductivity. The thermal conductor and the cooling jacket are fixed by a threaded connection, and the substrate mounting the thermal conductor or the semiconductor elements may be deformed or broken due to unbalance of stress caused by fixing of the thermal conductor and the cooling jacket, or thermal stress caused by the difference of the coefficients of the thermal expansion of the thermal conductor and the cooling jacket.

In general, a ceramic thermal conductor and a copper cooling jacket have been used taking into consideration the electrical insulation, thermal conductivity and manufacturing thereof. Since the coefficients of thermal expansion of the ceramic thermal conductor and the copper cooling jacket are different, respectively, thermal stress is generated when they go through heat cycle so that they are broken.

SUMMARY OF THE INVENTION

An object of the present invention is to provide a semiconductor cooling module which has a simple structure and is superior to heat radiation.

The above-mentioned object of the present invention is attained by forming the thermal conductor and the cooling jacket unitary whereby the heat generated during the operation of the semiconductor elements is conducted effectively to the cooling medium.

The essential features of the present invention can be represented by the following examples.

(1) A plurality of semiconductor elements are mounted on a substrate. A thermal conductor is provided to conduct the heat generated from the semiconductor elements to a cooling medium. A thermal medium is provided between the semiconductor elements and a conductor to be conducted heat. The conductor to conduct heat constitutes a cooling jacket which is capable of introducing and pumping out the cooling medium.

(2) A plurality of semiconductor elements are mounted on a substrate. A thermal conductor is provided to conduct the heat generated from the semiconductor elements to a cooling medium. A plurality of cooling elements are provided between the semiconductor elements and the thermal conductor for conducting the neat to the thermal conductor. The cooling elements have a shape which is able to follow the inclination and disposition of the semiconductor elements. The cooling elements are inserted between the heat portion of the semiconductor elements and the thermal conductor using elastic materials, respectively. A plurality of channels for enable a flow of the cooling medium are formed corresponding to the shape and arrangement of the cooling elements. The channels for the cooling medium are formed by the thermal conductor and a channel plate.

Since the cooling medium channels are formed in accordance with the shape and arrangement of the cooling medium, the conducting length of the heat from the semiconductor elements to the cooling medium can be shortened, and the thermal resistance between the semiconductor elements and the cooling medium becomes small compared with the conventional semiconductor cooling module which has the cooling jacket and the thermal conductor separately. One reason for the small thermal resistance is that the contacting portions between the thermal conductor and the cooling jacket can be eliminated by adopting the structure in which the thermal conductor is itself the cooling jacket. Another reason for the small thermal resistance is is that the cooling medium channel is provided on the thermal conductor in accordance with the shape and arrangement of the cooling elements.

DETAILED DESCRIPTION OF THE PREFERRED EMBODIMENTS

Figure 1:
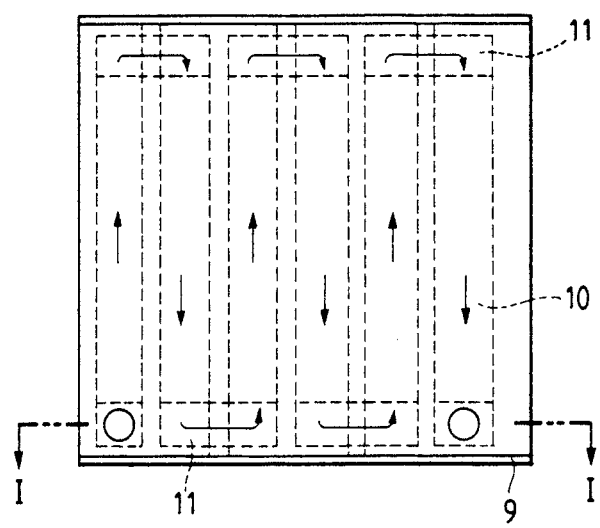
FIG. 1 shows a top view of the first embodiment of the present invention.
Figure 2:
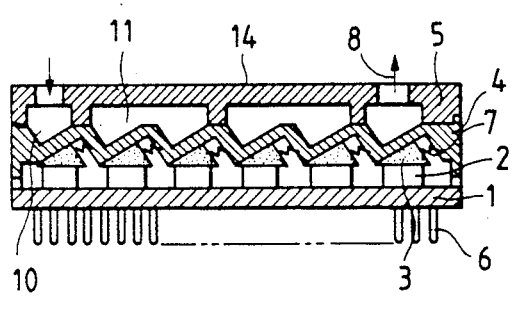
FIG. 2 illustrates a sectional view along I-I shown in FIG. 1.
Figure 3:
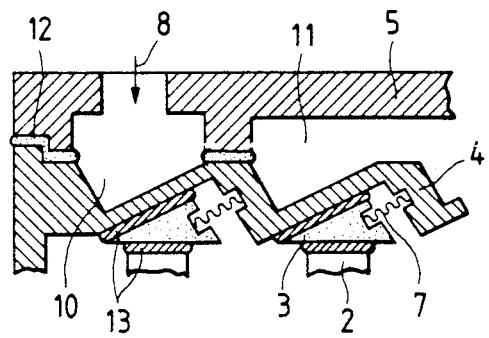
FIG. 3 is a partial enlarged sectional view of FIG. 2.

Referring to FIGS. 1 to 3, wedge-shaped cooling elements 3 having superior cooling efficiency are used as cooling elements of the semiconductor cooling module. Arrows shown in FIG. 1 indicate the flowing directions of the cooling medium 8 within the cooling jacket. The channel 10 of the cooling medium 8 is formed in such a manner that the cooling medium 8 flows in a zigzag pattern through the bending channel 11 shown by the dotted line. As shown in FIG. 2, the heat generated from the semiconductor elements 2 mounted on the substrate 1 is conducted to the cooling medium 8 through the wedge-shaped cooling elements 3 and the wall of the thermal conductor 4 which has continuously a number of sawtooth-shaped sections. The body of the cooling jacket 14 is formed unitary by the thermal conductor 4 and the channel plate 5. As shown in FIG. 3, the wedge-shaped cooling elements 3 are compressed by the compression spring 7 as if each wedge of the cooling element 3 is driven between each semiconductor element 2 and the thermal conductor 4 so as to contact the cooling element 3, the semiconductor element 2 and the thermal conductor 4. For example a layer 13 thermal conductive grease for example, a mixed corpuscular oxidized zinc powder with a silicon grease, is applied to the contacting portions between the semiconductor element 2 and the cooling element 3 and between the cooling element 3 and the thermal conductor 4, respectively, for decreasing the thermal resistance and improving adhesion among them. Instead of the abovementioned thermal conductive grease, a thermal conductive grease which is a mixture of a corpuscular aluminum nitride powder with a silicon grease can be used.

The wedge-shaped cooling elements 3 have a function to follow the inclination and disposition of the semiconductor elements 2 mounted on the module substrate 1, make the contact of the semiconductor element 2 and the thermal conductor 4 firmly and conduct the heat generated from the semiconductor elements effectively.

According to the present invention, the wall thickness of the thermal conductor 4 which forms the bottom of the cooling jacket 14 and contacts to the cooling elements 3 can be made thin extremely compared with that of the prior art. Since the thermal conductor 4 is formed to have sawtooth section in accordance with the wedge-shaped cooling elements 3, the wall thickness of the thermal conductor 4 can be made in the degree of approximately 2 mm with no strength problem and the thermal resistance also can be decreased compared with the prior art. In the prior art, the wall thickness of the thermal conductor can not be smaller than 10 mm due to it its construction.

In the embodiment explained above, the cooling medium channel 10 is formed by the V-shaped notches comprising the thermal conductor 4 which has the sawtooth-shaped section, and the channel plate 5. The channels 10 and 11 are formed in such that the cooling medium flows in a zigzag pattern along the longitudinal direction of the cooling elements or the thermal conductor.

The thermal conductor 4 and the channel plate 5 are connected by the connecting material 12 as shown in FIG. 3. The connecting material is selected depending on the type of materials of the thermal conductor and the channel plate. For instance, when a silicon carbide sintered body which is one kind of high thermal conductive ceramic is used for the thermal conductor 4 and the channel plate 5, the connecting surfaces thereof are soldered after the surfaces are metalized by a silver solder containing titanium. The thermal conductor 4 and the channel plate 5 also can be made of a metal material such as copper or aluminum which has a thermal conductivity of larger than 170W/mK. In this case, the metal contacting surfaces are connected by diffusion bonding. The above-mentioned connecting method can be applied to the side plate 9 shown in FIG. 1. A bonding material of an organic compound system can be used instead of the above-mentioned connecting material. However, it is important that the bonding material having a cooling medium resistance is selected, since the contacting portion contacts the cooling medium. In general, since the operating temperature of the semiconductor elements is preferably selected to be lower than 85° C., the bonding material is affected by heat cycles in some degree. Accordingly, it is preferable to use a mixture of an inorganic filling material as the bonding material considering from the thermal expansion coefficient. For example, an epoxy resin boding material filled with silica powder or silica glass powder can be used. Specifically, spherical melting silica is very useful, since it is possible to mix more than 80 weight % to total bonding material so that the connecting portion 12 having low thermal expansion coefficient can be obtained. By using the cooling jacket 14 which is formed by connecting the thermal conductor 4 and the channel plate 5, a semiconductor cooling module having a low thermal resistance can be formed.

The above-mentioned semiconductor cooling module can be inserted or fixed to another circuit board (not shown) by providing connecting pins 6 as shown in FIG. 2.

The material of the thermal conductor 4, is preferable an electrical insulating ceramic. When a metal such as copper or aluminum is used as the thermal conductor, it must be insulated electrically. When the metal thermal conductor is affected by heat cycles, it causes a friction with the cooling elements so that it might cause falling of the metal powder of the thermal conductor onto the semiconductor elements and damage high price semiconductor elements. Accordingly, the metal thermal conductor has to be treated very carefully.

Referring to FIG. 1 of U.S. Pat. No. 4,193,455, the cooling module of the prior art comprises the piston-type cooling elements 26, the cylinder provided at the thermal conductor 16 for receiving the cooling elements and the cooling jacket 45 which is manufactured separately from the thermal conductor 16, and the jacket 45 is fixed on the back surface of the thermal conductor 16.

Figure 4:
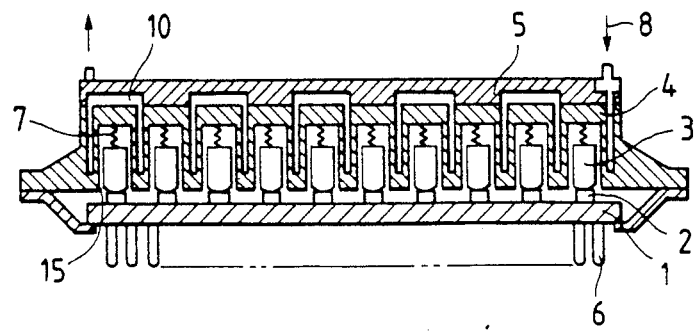
FIG. 4 illustrates a sectional view of the second embodiment of the present invention.
Figure 8:
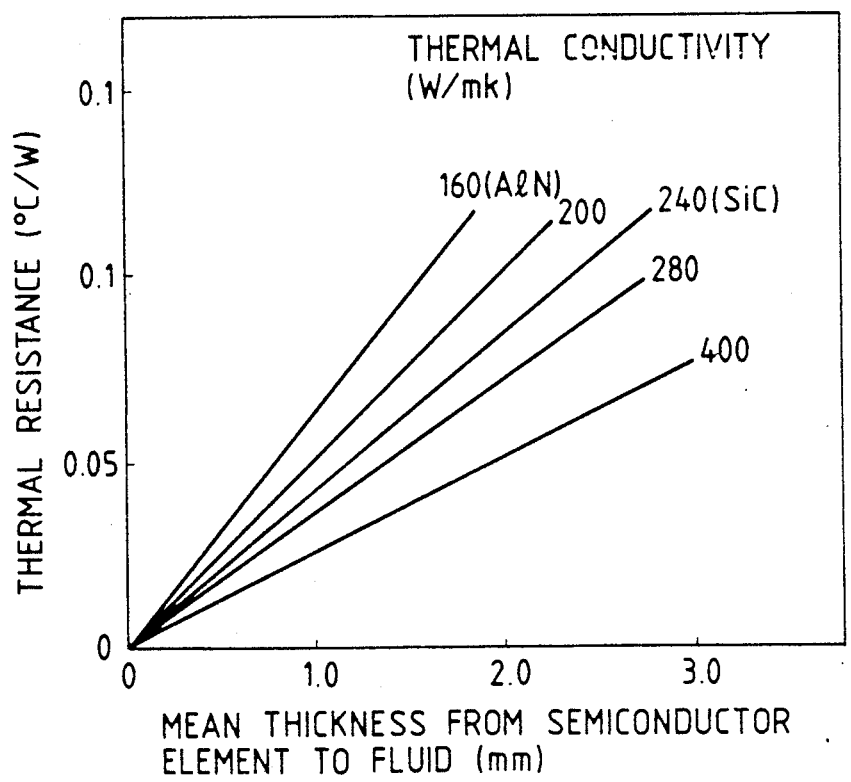
FIG. 8 is a diagram showing the relation between mean thickness from semiconductor elements to cooling fluid and thermal resistance.

In the embodiment of the present invention shown in FIG. 4, the cooling medium channel 10 is provided at the peripheral walls of the thermal conductor 4 which surround the pistons having a predetermined air gap therebetween and the cooling jacket 5 and the thermal conductor 4 are unitarily formed. The cooling medium channel provided above the cooling elements 3 is connected to the channel provided around the walls of the thermal conductor 4 which surround each piston 15. By connecting the turning channel 11 in turn which is provided at the channel plate, the channel is formed so as enable the cooling medium to flow and turns at each row of the channel. The thickness of the materials of the semiconductor elements 2, layer 13, cooling elements 3 and thermal conductors 4 which conduct the heat generated from the semiconductor elements 2 and the thermal resistance have the proportional relationship as shown in FIG. 8. When the thickness of the materials from the semiconductor elements 2 to the cooling medium 8 is decreased, the thermal resistance becomes small.

According to the embodiment shown in FIG. 4, the thickness of the thermal conductor 4 can be decreased to less than ⅓ a thickness of the prior art such as shown in FIG. 1 of U.S. Pat. No. 4,193,445, so that the cooling efficiency can be improved remarkably.

When the length of the cooling medium channel is increased, sometimes the temperature difference of the cooling medium between the inlet and the outlet becomes large. At this time, it is preferable to connect the channel parallel for flowing a plurality of cooling medium so as to cool the semiconductor elements easily, when there are two or three rows of the channel. This is arbitrarily selected by setting the shape and arrangement of the turning channel 11 of the channel plate. These examples are shown by FIGS. 5 and 6.

Figure 5:
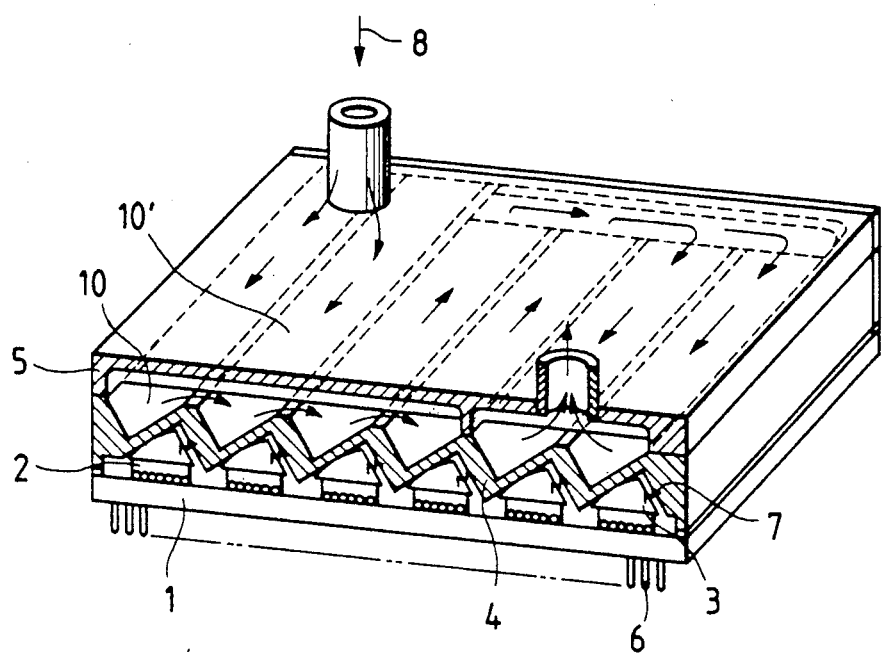
FIG. 5 illustrates a sectional perspective view of the third embodiment of the present invention in which two rows of the channels are arranged parallel.

FIG. 5 shows that two rows of the channel 10, 10' provided at the thermal conductor 4 are connected parallel. The turning channel 11 of the channel plate 5 is arranged so as to mount on the four notches of the thermal conductor 4, and the cooling medium 8 is branched parallel into two rows of the channel. In this case, even if the flow speed of the cooling medium flowing through each channel is same, twice amount of the cooling medium can be flown compared with that the cooling medium is flown by one row channel. By adopting the construction shown by FIG. 5, temperature rising of the cooling medium can be decreased.

Figure 6:
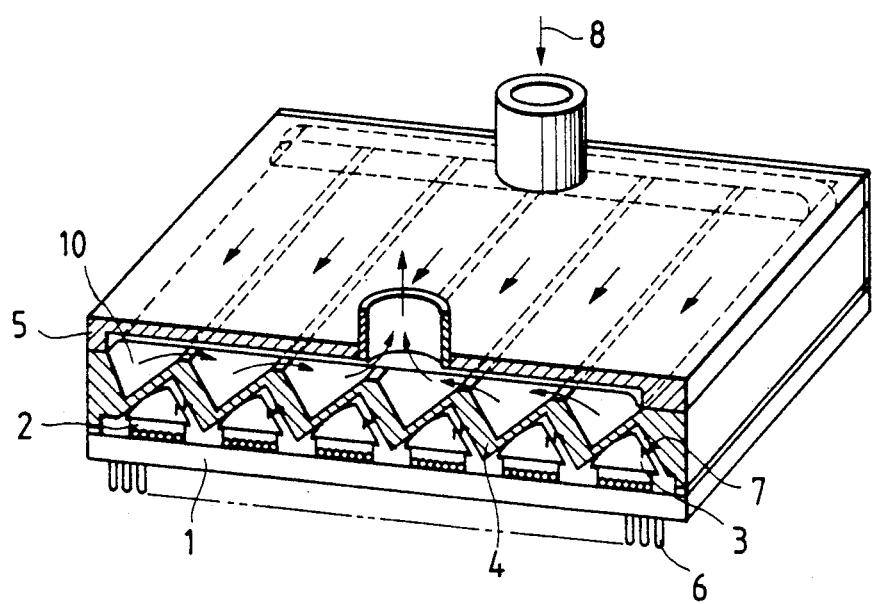
FIG. 6 illustrates a sectional perspective view of the fourth embodiment of the present invention in which all rows of the channels are arranged parallel.

FIG. 6 shows all rows of the channel are arranged parallel so that each channel is cooled by one passage of the cooling medium. In this case, temperature rising of the cooling medium corresponds to the heating value of the semiconductor elements which are arranged in one raw along the longitudinal direction of the V-shaped notch. Accordingly, the arrangement of the channel shown in FIG. 6 is profitable to cool the semiconductor elements having a lot of heating value.

In the embodiments shown in FIGS. 5 and 6, each contacting surface of the cooling element 3 to the thermal conductor 4 is curved. Of course, a thermal conductive grease (not shown) can be applied as in the embodiment of in FIG. 3. This curved contacting surfaces are also applied to the embodiment shown in FIGS. 2 and 3, although they are not shown in FIGS. 2 and 3.

Figure 7:
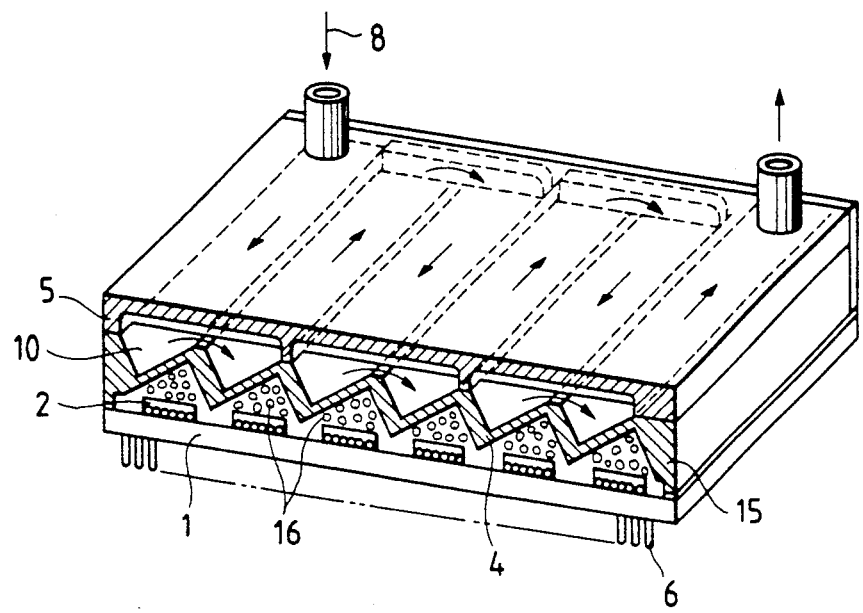
FIG. 7 illustrates a sectional perspective view of the fifth embodiment of the present invention in which cooling elements comprise a mixture of high thermal conductive corpuscular material and grease.

Referring to FIG. 7, the heat transfer medium 16 comprises solid particles having comparatively large particle diameter of several millimeters and thermal compound which is filled up among the gaps of the solid particles. The solid particles are made of high thermal conducting material, for instance, SiC. The thermal compound comprises mixture of corpuscular oxidized zinc powder and silicon grease or mixture of corpuscular aluminum nitride powder and silicon grease. The heat transfer medium 16 composed in the above-mentioned method is disposed between the thermal conductor 4 and the semiconductor elements 2. The semiconductor module shown in FIG. 7 has low thermal resistance and is able to easily follow the inclination or displacement of the semiconductor element.

According to the present invention, one portion of the cooling jacket is formed by the thermal conductor, so that the thermal resistance in the contacting portion is small and the distance between each semiconductor element and the cooling medium can be shorten. As a result, the present invention can provide a semiconductor cooling module having superior cooling efficiency compared with the conventional one. Since the cooling jacket of the present invention comprises a small number of elements, the semiconductor cooling module of the present invention can be formed in small and light.

What we claim is:

1. A semiconductor cooling module for cooling semiconductor elements, comprising:
   a plurality of semiconductor elements mounted on a substrate;
   a cooling element mounted on each of said semiconductor elements for transferring heat generated from said semiconductor elements, each of the cooling elements including a first, a second and a third side arranged so as to form a wedge, said first side of the respective cooling elements are disposed in contact with said semiconductor elements;
   a thermal conductor in contact with the second side of each of said cooling elements, said thermal conductor including a surface facing the third side of each cooling elements with a predetermined air gap therebetween and including a plurality of grooves for enabling a flow of a cooling medium along a surface of the thermal conductor opposite a surface in contact with the second side of said cooling elements, each groove being defined by the surface opposite the surface in contact with the second side of said cooling elements and the surface facing the third side of said cooling elements and extending in a longitudinal direction of the second side of each cooling element and a longitudinal direction of the third side of the cooling element;
   a compression spring inserted between said third side of each cooling element and said surface of said thermal conductor facing said third side; and
   a channel plate mounted directly on said thermal conductor for enabling a flow of said cooling medium.

2. A semiconductor cooling module according to claim 1, wherein a thermal conductive grease is applied between said semiconductor element and said first side of said cooling element and between said second side of said cooling elements and said thermal conductor, and wherein said thermal conductive grease is a mixture of a corpuscular oxidized zinc powder with a silicon grease for decreasing thermal resistance and improving mutual adhesion therebetween.

3. A semiconductor cooling module according to claim 1, wherein a thermal conductive grease is applied between said semiconductor element and said first side of said cooling element and between said second side of said cooling elements and said thermal conductor, and wherein said thermal conductive grease is a mixture of a corpuscular aluminum nitride powder with a silicon grease for decreasing thermal resistance and improving mutual adhesion therebetween.

4. A semiconductor cooling module according to claim 1, wherein said thermal conductor and said channel plate respectively comprise a silicon carbide sintered body, and mounting surfaces of said thermal conductor and said channel plate are soldered after the surfaces are metalized by a silver solder containing titanium.

5. A semiconductor cooling module according to claim 1, wherein said thermal conductor and said channel plate comprise a metal material having a thermal conductivity greater than 170W/mK, and mounting surfaces of said thermal conductor and said channel plate are formed by diffusion bonding.

6. A semiconductor cooling module according to claim 1, said thermal conductor comprises an electrical insulating ceramic.

7. A semiconductor cooling module according to claim 1, wherein each of said grooves has a V-shaped cross sectional configuration.

8. A semiconductor cooling module according to claim 1, wherein said thermal conductor has a bent channel portion for bending a flow direction of said cooling medium along the longitudinal direction of said channel.

9. A semiconductor cooling module according to claim 1, wherein said thermal conductor includes means for enabling a flow of said cooling medium in parallel to the longitudinal direction of said channel.

10. A semiconductor cooling module for cooling semiconductor elements, comprising:
a plurality of semiconductor elements mounted on a substrate;
cooling elements respectively mounted on said semiconductor elements, each of said cooling elements including a first, a second and a third side arranged so as to form a wedge, said first sides of the respective cooling elements are disposed in contact with said semiconductor elements through a thermal conductive grease which is a mixture of a corpuscular oxidized zinc powder with a silicon grease;
a thermal conductor comprising a silicon carbide sintered body, said thermal conductor having a first surface in contact with said second side of each cooling element through a thermal conductive grease which is a mixture of a corpuscular oxidized zinc powder with a silicon grease, and a second surface facing said third side of each cooling element with a predetermined air gap therebetween, said thermal conductor further comprising V-shaped notches for enabling a flow of a cooling medium on a surface thereof opposite said first surface in contact with said second side of said cooling elements, each of said notches are defined between the surface of the thermal conductor opposite said first surface and the surface of the thermal conductor facing said third side of said cooling elements and extending in a longitudinal direction of the second side of each cooling element and in a longitudinal direction of the third side of the cooling element;
a compression spring inserted between said third side of each cooling element and said surface of said thermal conductor facing said third side; and
a channel plate comprising a silicon carbide sintered body directly mounted on said thermal conductor for enabling a flow of said cooling medium, wherein mounting surfaces of said thermal conductor and said channel plate are soldered after the mounting surfaces are metalized by a silver solder containing titanium.

11. A semiconductor cooling module for cooling semiconductor elements, comprising:
a plurality of semiconductor elements mounted on a substrate;
cooling elements respectively mounted on each of said semiconductor elements, each of said cooling elements including a first side, a second side and a third side arranged so as to form a wedge, said first side of the respective cooling elements are disposed in contact with said semiconductor elements through a thermal conductive grease which is a mixture of a corpuscular aluminum nitride powder with a silicon grease;
a thermal conductor comprising a silicon carbide sintered body, said thermal conductor having a first surface in contact with said second side of each of said cooling elements through a thermal conductive grease which is a mixture of a corpuscular aluminum nitride powder with a silicon grease, and a second surface facing said third side of each of said cooling elements with a predetermined air gap therebetween, said thermal conductor further comprises a plurality of V-shaped notches for enabling a flow of a cooling medium on a surface thereof opposite said first surface in contact with second side of said cooling elements, each of said notches is defined between the surface of the thermal conductor opposite said first surface, and the surface of the thermal conductor facing said third side of said cooling elements and extending in a longitudinal direction of the second side of each cooling element and in a longitudinal direction of the third side of the cooling element;
a compression spring inserted between said third side of each cooling element and said surface of said thermal conductor facing said third side; and
a channel plate comprising a silicon carbide sintered body and being mounted on said thermal conductor for enabling a flow of said cooling medium, wherein mounting surfaces of said thermal conductor and said channel plate are soldered after the surfaces are metalized by a silver solder containing titanium.

12. A semiconductor cooling module for cooling semiconductor elements, comprising:
a plurality of semiconductor elements mounted on a substrate;

cooling elements respectively mounted on said semiconductor elements, each of said cooling elements including a first, a second and a third side arranged so as to form a wedge, said first side of the respective cooling elements is disposed in contact with the semiconductor elements and comprise a mixture of thermal conductive corpuscular material and grease;

a thermal conductor including a first surface in contact with said second side and a second surface which contacts said third side of each cooling element so as to define a plurality of triangular convex portions, said thermal conductor comprising a silicon carbide sintered body having a plurality of V-shaped notches for enabling a flow of a cooling medium on a surface opposite said first surface in contact with said second side of said cooling elements, each notch being defined between the surface of the thermal conductor opposite said first surface and the surface of said thermal conductor in contact with said third side of said cooling elements and extending in a longitudinal direction of said second side of each cooling element and of the thermal conductor provided above the third side and along in a longitudinal direction of the third side of each cooling element; and a channel plate comprising a silicon carbide sintered body mounted on said thermal conductor for enabling a flow of said cooling medium, wherein mounting surfaces of said thermal conductor and said channel plate are soldered after the surfaces are metalized by a silver solder containing titanium.

13. A semiconductor cooling module according to claim 12, wherein said thermal conductor includes a bent channel for bending a flow direction of said cooling medium along the longitudinal direction of said channel.

14. A semiconductor cooling module according to claim 12, wherein said thermal conductor includes means for enabling a flow of said cooling medium in parallel to the longitudinal direction of said channel.

15. A semiconductor cooling module for cooling semiconductor elements, comprising:

a plurality of semiconductor elements mounted on a substrate;

a plurality of piston-type cooling elements respectively in contact with said semiconductor elements;

a thermal conductor including a plurality of bottomed cylinders each having walls respectively surrounding surfaces of the respective cooling elements with an air gap being provided between the walls of the respective cylinders and the cooling elements, said cooling elements being slidably moveable into the respective cylinders of the thermal conductor;

a compression spring inserted between the bottom of each cylinder and a bottom of each cooling element; and a cooling jacket fixed to a back surface of said thermal conductor and having an inlet and an outlet for introducing and pumping out a cooling medium, the cooling jacket including a plurality of channels connected to the inlet and the outlet and comprising a first cooling medium channel provided along a longitudinal direction of each wall, a second cooling medium channel connected to each first cooling medium channel and provided separately along a longitudinal direction of said thermal conductor, and turning channels for connecting the first and second cooling medium channels to the inlet and the outlet.

* * * * *